US012705414B2

(12) United States Patent
Choi et al.

(10) Patent No.: US 12,705,414 B2
(45) Date of Patent: Aug. 11, 2026

(54) LAYOUT VERSUS SCHEMATIC (LVS) DEVICE EXTRACTION USING PATTERN MATCHING

(71) Applicant: Synopsys, Inc., Mountain View, CA (US)

(72) Inventors: Soo Han Choi, Pleasanton, CA (US); Anil Karanam, Saratoga, CA (US); Elango Velayutham, Saratoga, CA (US); Yuli Xue, Shanghai (CN)

(73) Assignee: Synopsys, Inc., Sunnyvale, CA (US)

( * ) Notice: Subject to any disclaimer, the term of this patent is extended or adjusted under 35 U.S.C. 154(b) by 854 days.

(21) Appl. No.: 17/734,514

(22) Filed: May 2, 2022

(65) Prior Publication Data

US 2022/0350950 A1 Nov. 3, 2022

Related U.S. Application Data

(60) Provisional application No. 63/182,513, filed on Apr. 30, 2021.

(51) Int. Cl.
*G06F 30/398* (2020.01)

(52) U.S. Cl.
CPC .................................. *G06F 30/398* (2020.01)

(58) Field of Classification Search
CPC ...... G06F 30/398; G06F 30/30; G06F 30/394; G06F 2111/04; G06F 30/392; G06F 2119/12; G06F 30/20; G06F 30/367; G06F 2111/12; G06F 30/00; G06F 2111/20; G06F 30/327; G06F 30/39; G06F 30/31; G06F 30/3323; G06F 21/79; G06F 30/33; G06F 2111/08; G06F 2119/18; G06F 30/23; G06F 30/27; G06F 30/3308; G06F 30/347; G06F 2119/16; G06F 3/0445; G06F 3/0443; G06F 16/00; G06F 30/12; G06F 2117/12; H01L 2224/48227; H01L 2224/73265; H01L 24/48; H01L 23/3677; H01L 22/24; H01L 22/26; H01L 23/528; H01L 23/576; G03F 7/70441; G03F 1/36; G03F 7/70433; G03F 7/70655; G03F 7/705; G03F 7/7065; G03F 1/70; G03F 1/00; G03F 7/70625
USPC .................................................. 716/108–115
See application file for complete search history.

(56) References Cited

U.S. PATENT DOCUMENTS

| | | | | |
|---|---|---|---|---|
| 2005/0251771 | A1 * | 11/2005 | Robles | G06F 30/367 716/54 |
| 2015/0020041 | A1 * | 1/2015 | Hung | G06F 30/392 716/112 |
| 2016/0063166 | A1 * | 3/2016 | Hsieh | G06F 30/398 716/112 |
| 2016/0306910 | A1 * | 10/2016 | Tseng | G06F 30/39 |
| 2018/0004888 | A1 * | 1/2018 | Park | G06T 7/0006 |
| 2018/0315709 | A1 * | 11/2018 | Schultz | H10D 89/10 |
| 2021/0133383 | A1 | 5/2021 | Gao et al. | |

* cited by examiner

*Primary Examiner* — Binh C Tat
(74) *Attorney, Agent, or Firm* — Lowenstein Sandler LLP

(57) ABSTRACT

A method includes obtaining a target integrated circuit (IC) layout, accessing a repository, identifying a device within the target IC layout by matching an area of the target IC layout to a source pattern, and replacing at least a portion of the area of the target IC layout with a replacement pattern. The repository stores the source pattern for the device and the replacement pattern corresponding to the source pattern.

18 Claims, 19 Drawing Sheets

Source patterns (Device layers)

Optional marker layers (Body/terminal layers)

Extent layer (Cell boundary)

422

700

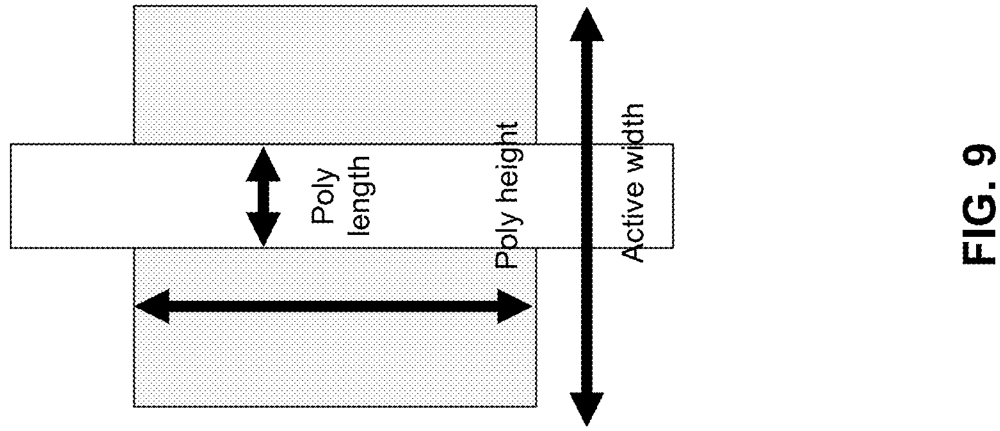
FIG. 9
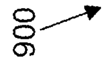

LAYOUT VERSUS SCHEMATIC (LVS) DEVICE EXTRACTION USING PATTERN MATCHING

RELATED APPLICATION

The present application claims the benefit under 35 U.S.C. § 119(e) of U.S. Provisional Patent Application No. 63/182,513 filed on Apr. 30, 2021, which is incorporated herein by reference in its entirety for all purposes.

TECHNICAL FIELD

The present disclosure relates generally to an electronic design automation (EDA) system. In particular, the present disclosure relates to layout versus schematic (LVS) device extraction using pattern matching.

BACKGROUND

Physical verification before tape-out in integrated circuit design and manufacturing includes design rule checking (DRC) and layout versus schematic (LVS). DRC checks for layout rules to ensure the circuit design may be manufactured reliably. LVS checks the functional correctness of a netlist of a circuit design. LVS checking compares an extracted netlist from the layout to an original schematic netlist to determine whether they match.

SUMMARY

In some aspects, a method includes obtaining a target integrated circuit (IC) layout, accessing a repository, identifying a device within the target IC layout by matching an area of the target IC layout to a source pattern, and replacing at least a portion of the area of the target IC layout with a replacement pattern. The repository stores the source pattern for the device and the replacement pattern corresponding to the source pattern.

In some aspects, a system includes a repository, a memory, and a processor. The repository stores a source pattern for a device, and a replacement pattern corresponding to the source pattern. The memory stores instructions. The processor, coupled with the memory and to execute the instructions, the instructions when executed cause the processor to obtain a target integrated circuit (IC) layout, identify the device within the target IC layout by matching an area of the target IC layout to the source pattern and replace at least a portion of the area of the target IC layout with the replacement pattern.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 9 is a schematic that shows a source pattern of the pattern library that can detect devices having various poly length/height and active width, in accordance with an embodiment of the present disclosure.

DETAILED DESCRIPTION

Aspects of the present disclosure relate to layout versus schematic (LVS) device extraction using pattern matching.

Layout versus schematic, performed before tape-out, checks for the functional correctness of the physical implementation of a netlist of a design. LVS checking compares an extracted netlist from the layout to an original schematic netlist to determine whether they match. Turn-around time (TAT) of LVS is important. LVS runtime has dramatically increased as the design rules and device nodes are getting smaller.

LVS has three stages: (1) device extraction; (2) connect/texting (text short/open and c_thru); and (3) compare. In process technology such as 16 nanometers (nm), device extraction take about 15% to 20% of a total LVS runtime, but in other types of process technology such as 5 nm and 3 nm, device extraction takes around about 30% to 40% of the total LVS runtime. Thus, a runtime reduction of the device extraction stage can be a significant factor to improve the total LVS runtime.

Since the layout-device is typically executed by Boolean operations and recent technology has more inter-cell devices, leveled-out (hierarchical) device causes more accuracy issues in LVS results. Therefore, more accurate results may be obtained when the extracted devices are located in the originating cell.

In some embodiments, to resolve the above-mentioned problems (e.g., long device extraction runtime in recent technology node, leveled-out device due to complex Boolean operations), the approaches described herein utilize pattern matching (PM) techniques for device extraction.

A typical device extraction flow uses complex Boolean operations to generate a body layer (gate) and terminal layers (source/drain). In contrast, in or more embodiments, the present method uses a pattern library and pattern matching to detect the devices and extract the body/terminal layers. Since the pattern library already includes output layers (i.e., body/terminal layers), most of Boolean operations found in the device extraction stage of typical LVS can be eliminated.

Technical advantages of the present disclosure include, but are not limited to, reducing device extraction time as a result of eliminating many Boolean operations during the device extraction stage. In addition, pattern matching can output the body and terminal layers at a cell level, so that pattern matching also minimizes the accuracy issues coming from leveled-out devices. This can resolve the device leveled-out issue induced from Boolean operations in conventional LVS.

Figure 1:
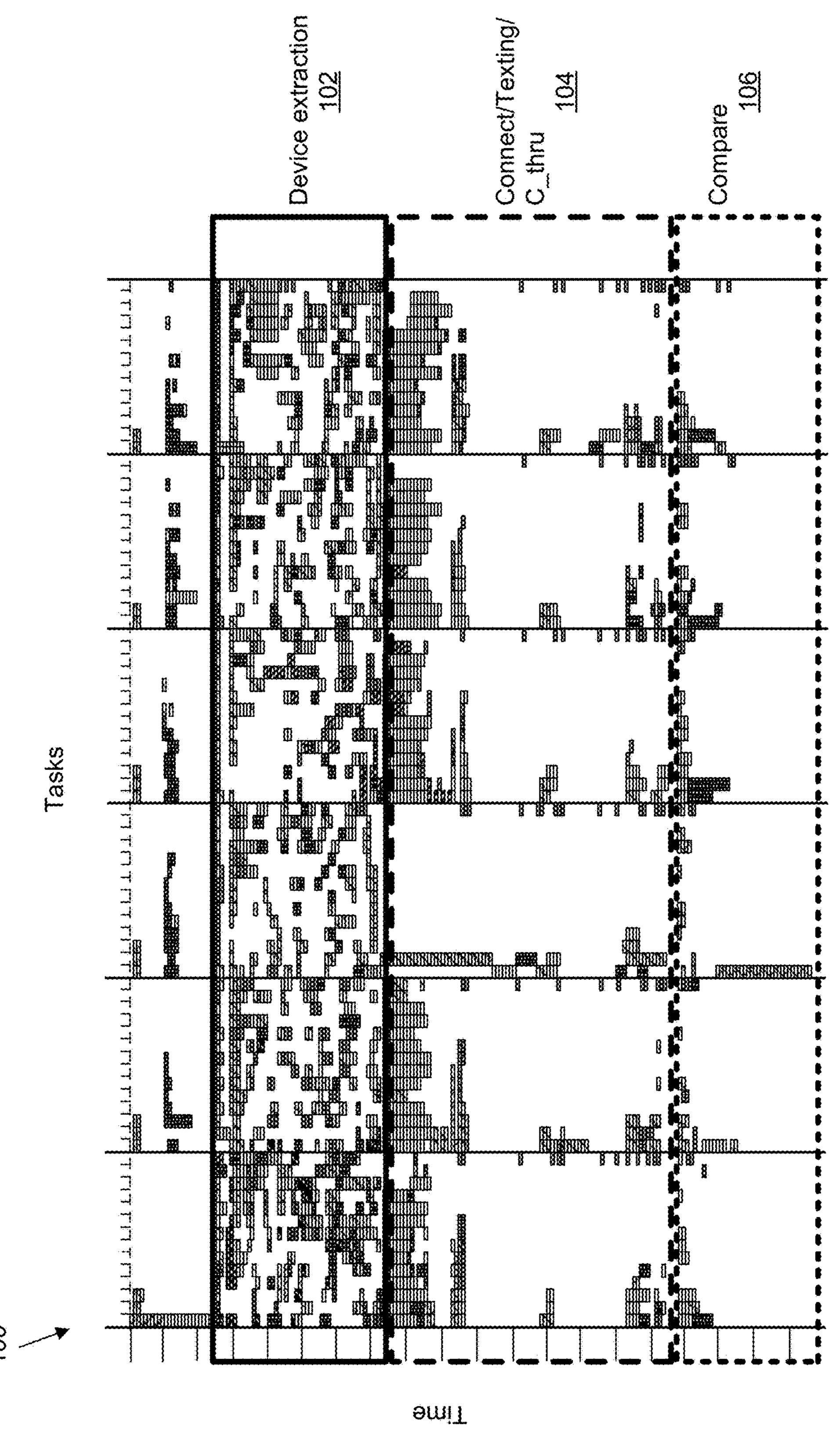
FIG. 1 is a schematic that shows LVS runtime, in accordance with an embodiment of the present disclosure.

FIG. 1 is a schematic 100 that shows typical LVS runtime in accordance with an embodiment of the present disclosure. LVS may include three stages: device extraction, connect/texting (text short/open and c_thru), and compare. During device extraction stage, layers within a layout database are analyzed and all the devices and nets are extracted. In some aspects, Boolean operations are applied to extract the body layer. During connect and texting, connections between layers are made. During compare stage, the netlist from the layout and the netlist from the schematic are compared. Schematic 100 shows the runtime for the three stages of the LVS. As shown in schematic 100, device extraction consumes about 30% to about 40% of the total LVS runtime. Device extraction runtime increases as the device nodes are getting smaller.

Figure 2:
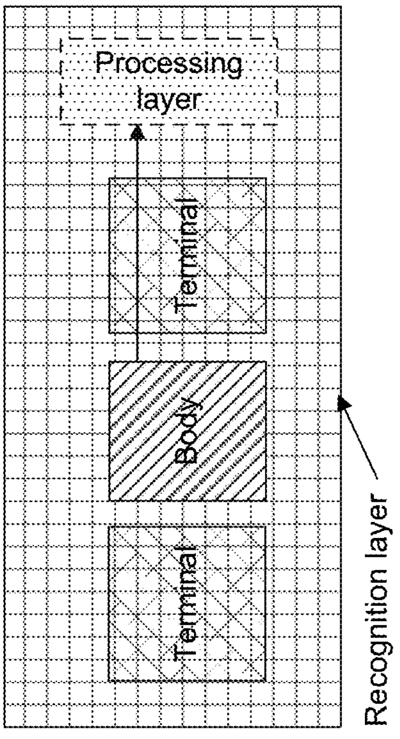
FIG. 2 is a schematic that shows device layer types generated by device extraction, in accordance with an embodiment of the present disclosure.
Figure 2:
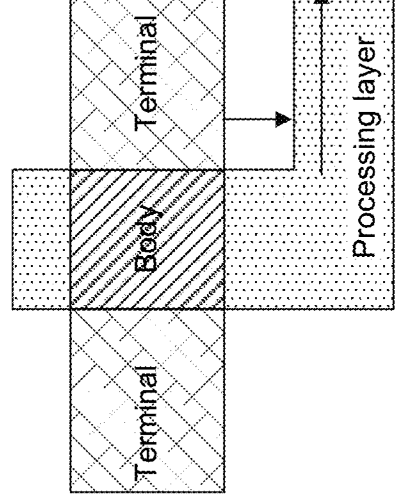

FIG. 2 is a schematic 200 that shows different device layer types generated at the device extraction stage for a layout. LVS device extraction generates device layers such as a body layer, a terminal layer, a recognition layer, and a processing layer by applying complex Boolean operations. The body layer seeds around the device that is formed. The terminal layer includes polygons representing electrical connections to the device. The recognition layer is used to indicate multi finger devices and/or when device layers do not directly interact with the body layer. The processing layer includes polygons of the layout. Polygons of the body layer, the terminal layer, and processing layers may be pushed up or down the hierarchy in order to co-locate all polygons inside a common cell.

An exemplary script of Boolean operations for the generation of the body layer is shown below.

```
gate1=gate1a and diffusion
gate2 =gate1 and SRAM_marker
edge_gate=
ngate=gate2 and edge_gate
tngate3a=ngate not_interacting SD
tngate3b=tngte3a not filter
n_real_gate_1=tngate3b and OD
n_real_gate_2= . . .
n_real_gate_3= . . .
n_real_gate_4= . . .
n_real_gate_5=n_real_gate_4 and OD2
n_real_gate_6=n_real_gate_5 and PO
n_real_gate_7= . . .
n_real_gate_8= . . .
n_real_gate=n_real_gate and NP
```

The script includes many and, not, or, and/or, interaction operations to generate single polygon shapes.

Figure 3:
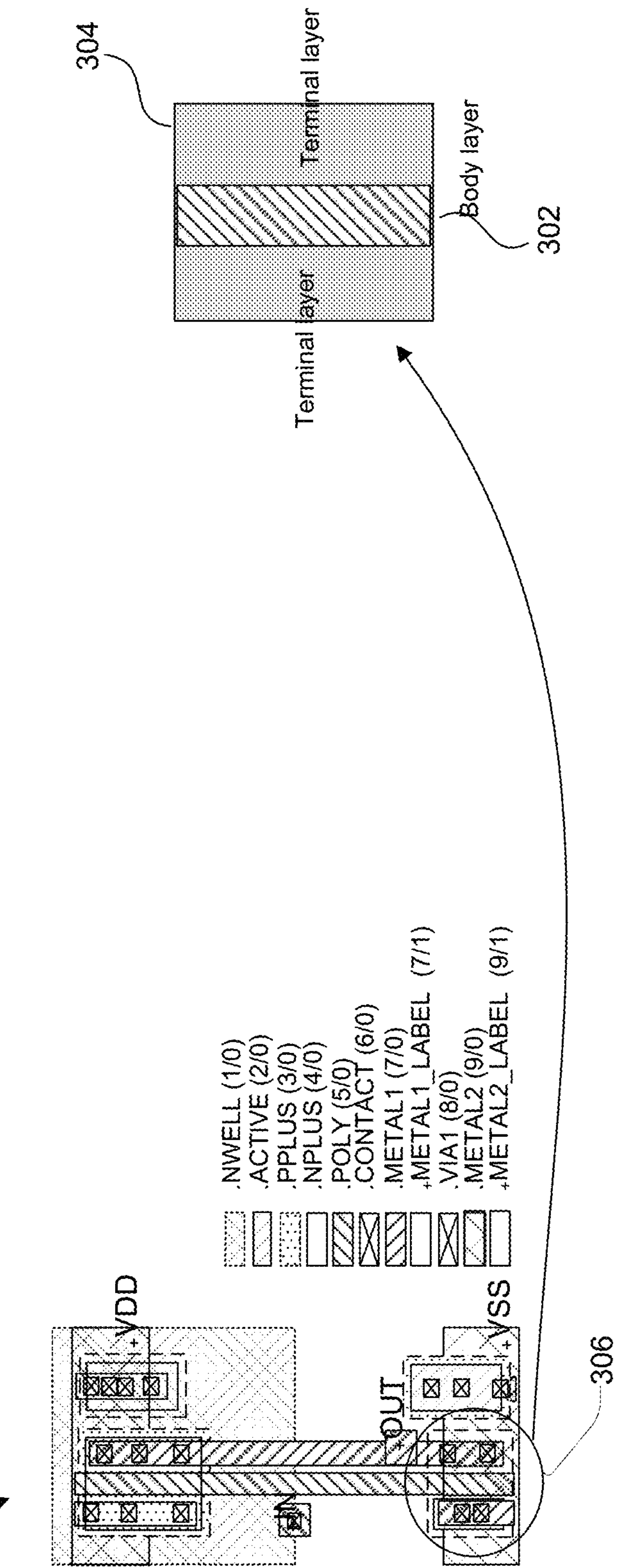
FIG. 3 is a schematic that shows an example body layer and a terminal layer, in accordance with an embodiment of the present disclosure.

FIG. 3 is a schematic 300 that shows a body layer 302 and a terminal layer 304 in accordance with an embodiment of the present disclosure. The body layer 302 and the terminal layer 304 corresponds to insert 306 of a transistor. The body layer 302 and the terminal layer 306 are part of a relatively simple group of polygons even though the original positive metal oxide semiconductor (PMOS) or NMOS transistor has a complex layout structure. The NMOS and PMOS transistors may have a complex layout structure that includes multiple layers. Therefore, if the body layer 302 and/or the terminal layer 304 can be generated without the complex Boolean operations and if the body layer and terminal layer can be kept inside a common cell as much as possible, the runtime of device extraction can be reduced dramatically.

In some embodiments, to overcome the runtime and device leveled-out issues of the conventional device extraction, a pattern matching-based device extraction method is disclosed.

Figure 4A:
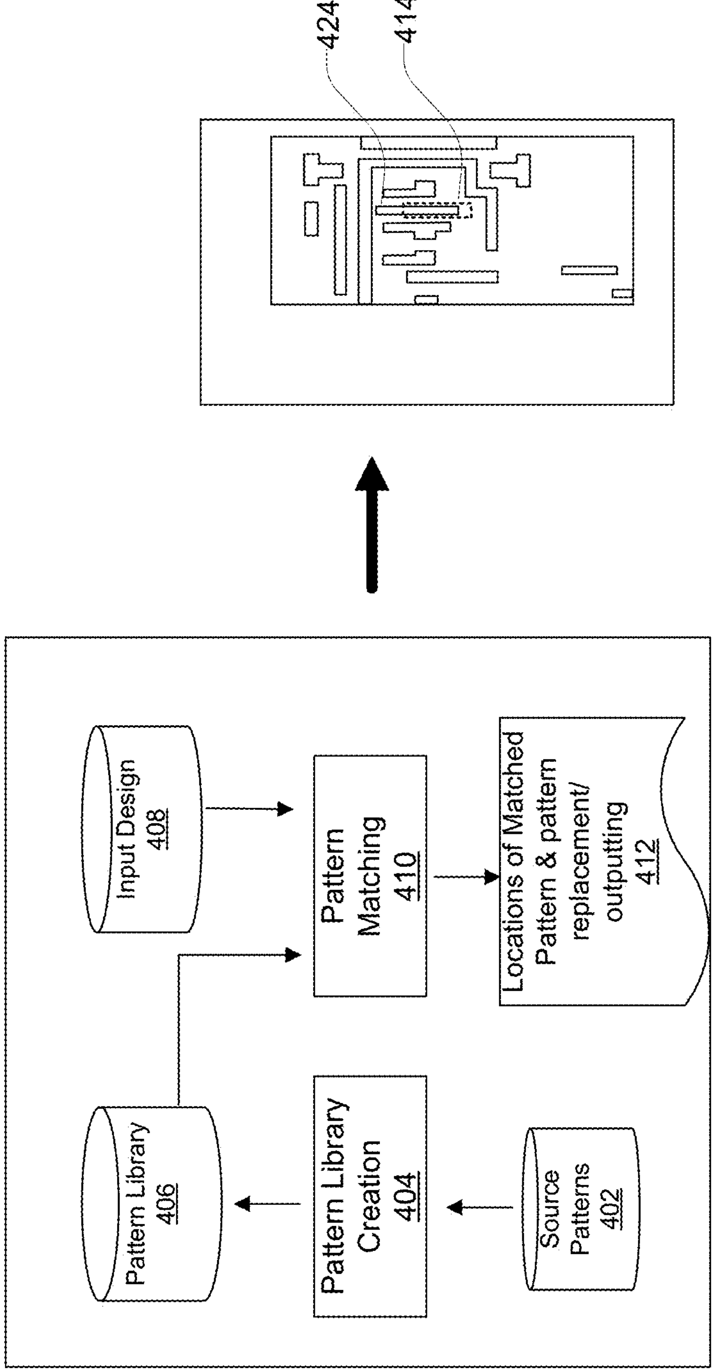
FIG. 4A is a schematic that shows pattern matching and applying pattern matching to device extraction, in accordance with an embodiment of the present disclosure.

FIG. 4A is a flow diagram 400 for pattern matching and replacement, in accordance with an embodiment of the present disclosure. A pattern library creation module 404 may receive source patterns 402 as input and create a pattern library or repository 406. The modules described herein may be implemented using a processor device (e.g., computer system 1700 of FIG. 17). In some aspects, the pattern library or repository 406 may be a part of a database. In some aspects, the pattern library or repository 406 may be stored in the data storage device 1718 of FIG. 17. Source patterns of the pattern library 406 contains device layers such as poly, active and related layers that form the body layer and the terminal layers. A pattern matching module 410 may receive as inputs the pattern library 406 and an input design 408 and further output optional marker layers and the matched locations 412. The pattern matching module 410 can output the body and terminal layers at the matched devices.

Figure 4B:
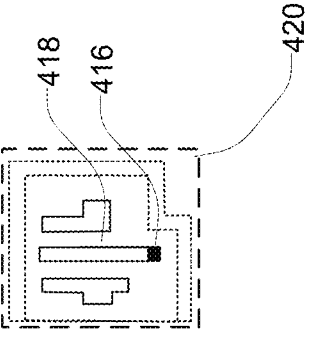
FIG. 4B is a schematic that shows a pattern library, in accordance with an embodiment of the present disclosure.

FIG. 4B is a schematic that shows an example pattern 422 in the pattern library 406, in accordance with an embodiment of the present disclosure. Pattern 422 includes source patterns 416, optional marker layers 418, and an extent layer 420 that represents a cell boundary. Example pattern 422 is matched with shape 414 and the optional marker layers are extracted. For example, shape 414 may be replaced with shape 424.

Figure 5:
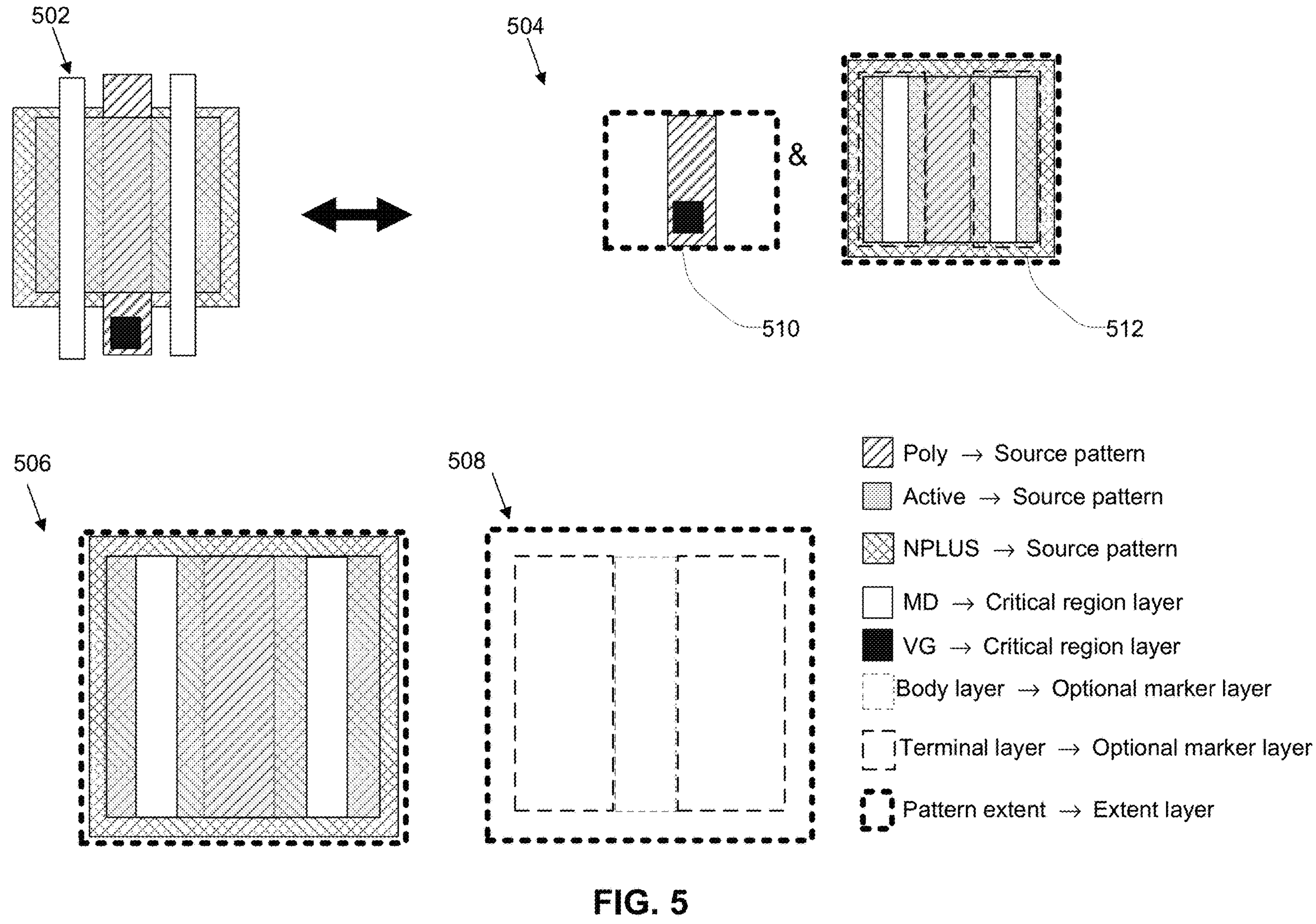
FIG. 5 is a schematic that shows a pattern library for a negative metal oxide semiconductor (NMOS) transistor, in accordance with an embodiment of the present disclosure.

FIG. 5 is a schematic that shows the contents of a pattern library 504 of a NMOS transistor 502, in accordance with an embodiment of the present disclosure. The pattern library 504 contains source patterns 506 and output layers or replacement patterns 508. The source pattern 506 includes a poly layer, an active layer, a NPLUS layer, and critical region layers (MD and VG) 504. The output layers 508 includes the body layer and the terminal layer. Schematic 510 shows the poly layer and a critical region layer. Schematic 512 shows the source pattern with the output layers or replacement patterns. Since the pattern library 504 contains both input layers 506 (i.e., poly layer, active layer, NPLUS layer) and output layers 508 (body layer, terminal layer layer), the approaches described herein can reduce the run time for device extraction by minimizing complex Boolean operations to generate the output layers. Pattern matching can keep output layers 508 inside a common cell as much as possible because of the cell-level operation of pattern matching. The cell-level operation of pattern matching means that pattern matching can handle the matched cells with a flatten view rather than a complex hierarchical view.

In some embodiments, there are multiple methods for generating the source patterns. In a first method, the foundry-provided standard cells and parameterized cells (Pcells) for passive devices (e.g., resistor and capacitor) with the exact matching is used. In a second method, a single transistor and a single passive device with the fuzzy matching are used. Other methods are also within the scope of the present disclosure. A single pattern library may store multiple source patterns generate by the same method and/or different methods.

In some embodiments, the foundry provides specific standard library cells and Pcells to a designer, the source patterns of the pattern library through exact copy of the device layers (e.g., poly, nactive, pactive, nwell) of all standard library cells and passive cells are stored. Therefore, the source patterns of the pattern library have the same shapes as the shapes shown in FIG. 6 and FIG. 7.

Figure 6:
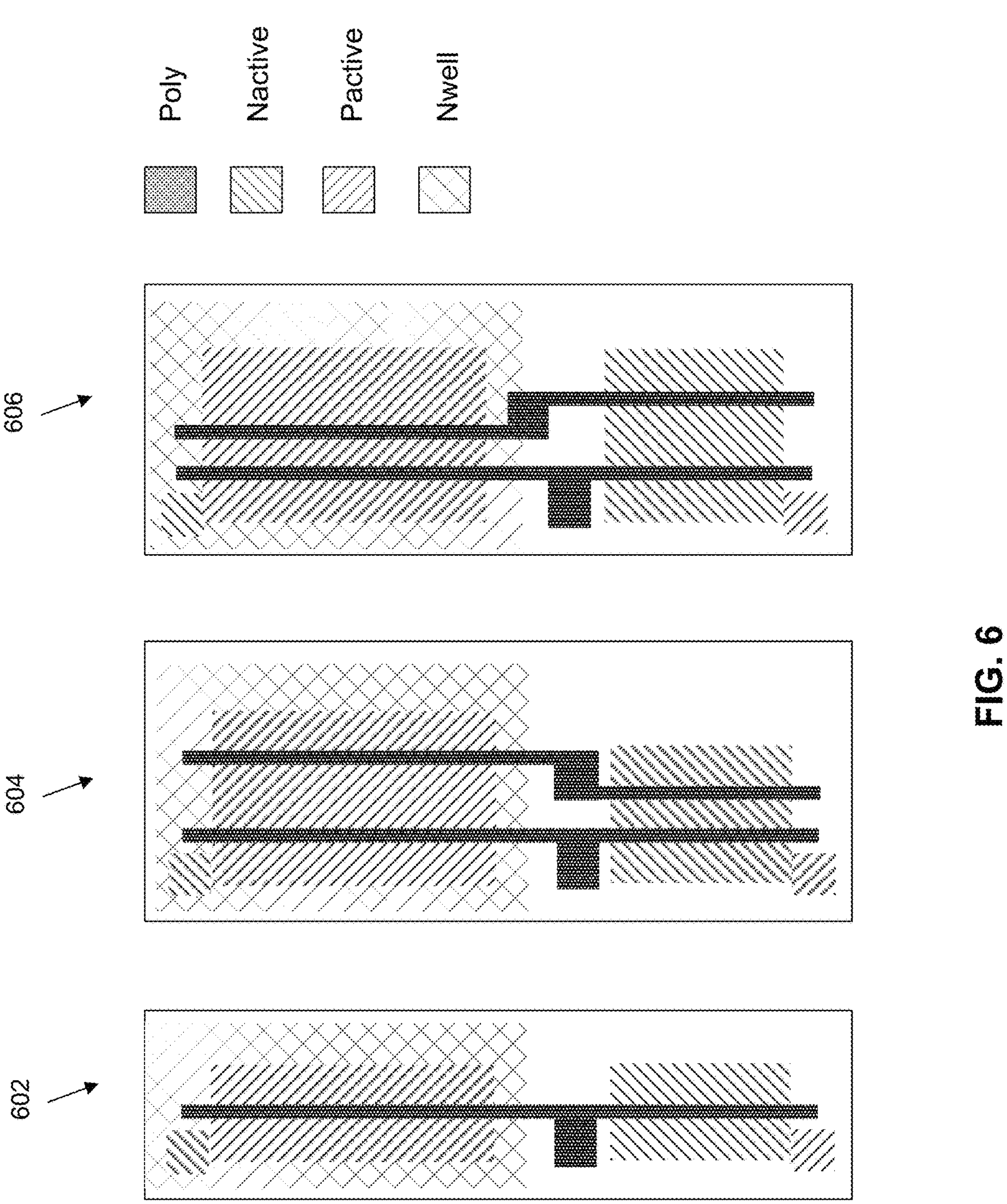
FIG. 6 is a schematic that shows standard cells provided by a foundry, in accordance with an embodiment of the present disclosure.

FIG. 6 is a schematic that shows layout of standard library cells provided by a foundry, in accordance with an embodiment of the present disclosure. The source pattern for an inverter 602, a NAND gate 604 and a NOR gate 606 are shown.

Figure 7:
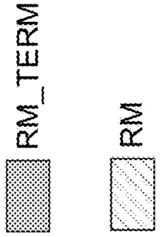
FIG. 7 is a schematic that shows a parameterized cell (Pcell) provided by a foundry, in accordance with an embodiment of the present disclosure.
Figure 7:
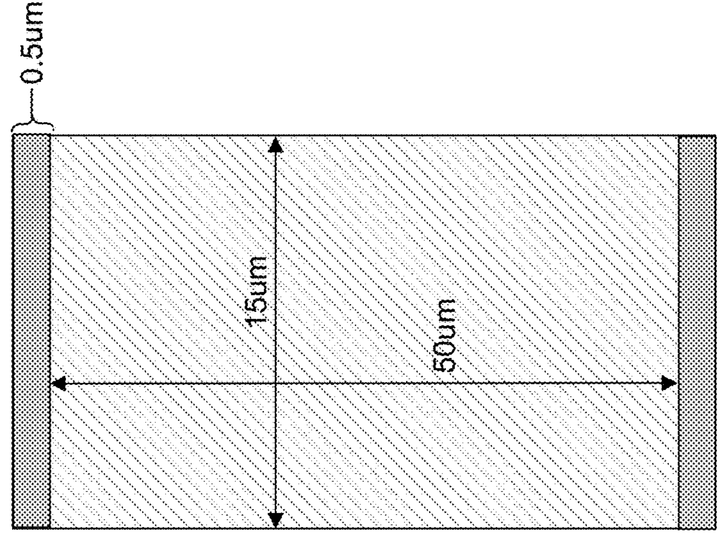

FIG. 7 is a schematic that shows a Pcell 700 provided by a foundry, in accordance with an embodiment of the present disclosure. Pcell 700 corresponds to an example resistor RM. In one example, Pcell 700 has a width of 15 μm, a length of 50 μm, and a terminal thickness of 0.5 μm.

The pattern library for all foundry provided standard library cells and Pcells may be generated as described further below.

By manipulating the device layers of standard cells (FIG. 6) and Pcells (FIG. 7), optional marker layers containing the body and terminal layers are generated that may be output in the matched location.

Figure 8A:
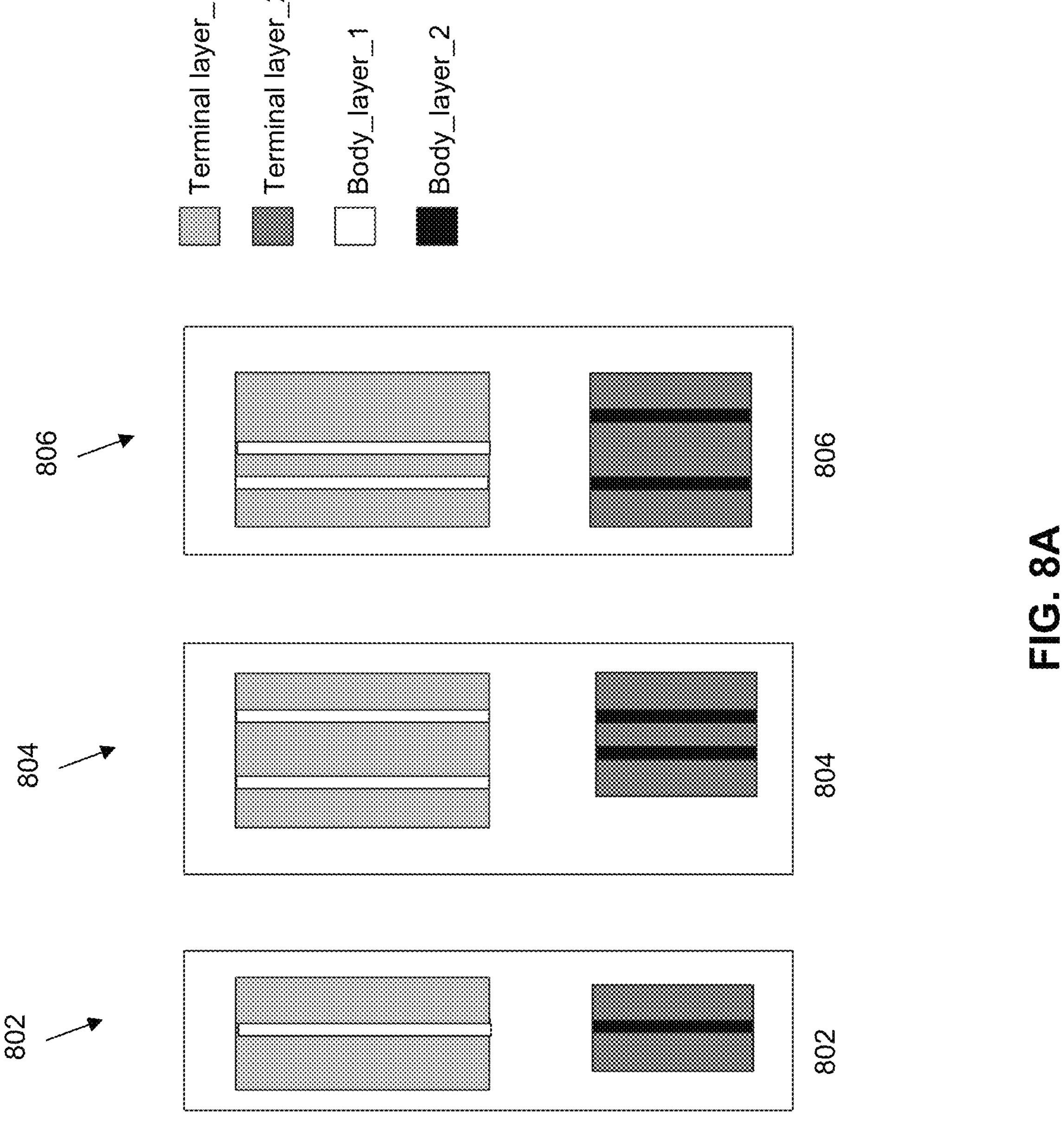
FIG. 8A is a schematic that shows optional marker layers, in accordance with an embodiment of the present disclosure.

FIG. 8A is a schematic that shows the optional marker layers for the standard cells, in accordance with an embodiment of the present disclosure. Optional marker layers 802 corresponds to the inverter 602. Optional marker layers 804 corresponds to NAND gate 604 and optional marker layers 806 corresponds to NOR gate 606. The center of the body layer is the same as the center of the poly layer in the source pattern 602 and the center of the terminal layer is the same as the center of the Nactive and Pactive layers.

Figure 8B:
FIG. 8B is a schematic that shows a representation of each cell in a pattern library using text identifier (ID), in accordance with an embodiment of the present disclosure.
Figure 8B:
Figure 8B:
Figure 8B:
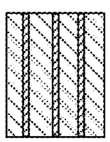
Figure 8B:
Figure 8B:
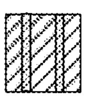
Figure 8B:
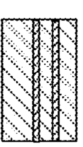
Figure 8B:
Figure 8B:
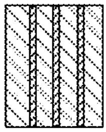

In some embodiments, all layers of the standard cells and Pcells are read. The devices layers (e.g., Vth layers, poly, active, nplus, and nwell) are converted with the source patterns of pattern library. The present method further provides a representation of each cell by using a text identifier (ID) (e.g., Inverter, NAND, and NOR) as shown in FIG. 8B. FIG. 8B shows the representation for an inverter, a three input NAND gate, a three input NOR gate, a two input NAND gate, and a two input NOR gate. Using the text ID, the present device extraction method is performed for each individual cell. A pattern extent layer that covers all device layers is generated by merging/sizing all representations of device layers. A pattern marker layer that is located at the center of pattern extent layer is also generated. Optional marker layers containing the body and terminal layers are generated and stored by applying the Boolean operations into the devices layers (e.g., Vth layers, poly, active, nplus, and nwell).

In some embodiments, instead of directly using foundry-provided standard library cells and Pcells, the source patterns of the pattern library are stored by using the single transistor that can support fuzziness (e. g., can detect devices having various poly length/height and active width).

FIG. 9 is a schematic that shows a single source pattern 900, in accordance with an embodiment of the present disclosure. Arrows in FIG. 9 indicates that pattern matching can detect devices having different poly length and/or height and active width. The poly length corresponds to a gate length. The poly height corresponds to a gate width. The pattern library contains information related to the various gate lengths and gate widths.

Figure 10:
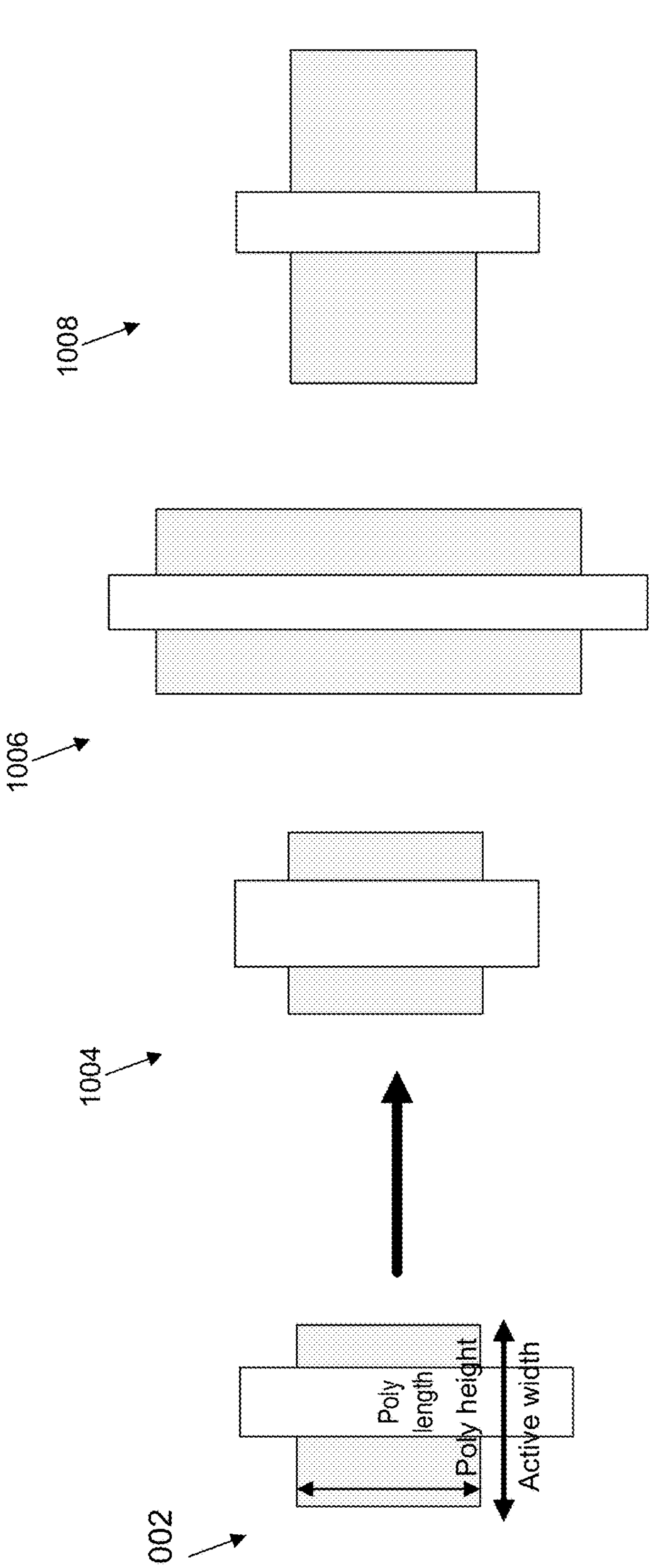
FIG. 10 is a schematic that shows pattern matching by using single source patterns with fuzziness, in accordance with an embodiment of the present disclosure.
Figure 10:

FIG. 10 is a schematic that shows pattern matching by using single source patterns with fuzziness, in accordance with an embodiment of the present disclosure. The library pattern may include a pattern 1002 and information associated with various height and/or width of the layers. The pattern matching can detect variations (e.g., different width and length) in the shape. For example, pattern matching can detect a first shape 1004, a second shape 1006, or a third shape 1008 in the layout.

In some embodiments, since the approaches described herein can automatically detect the devices having the various length/height of the poly and active layers, a separate pattern library for each standard cell and Pcell may not be used. And, the present method automatically generates the pattern library for all foundry-providing standard cells and Pcells.

Figure 11:
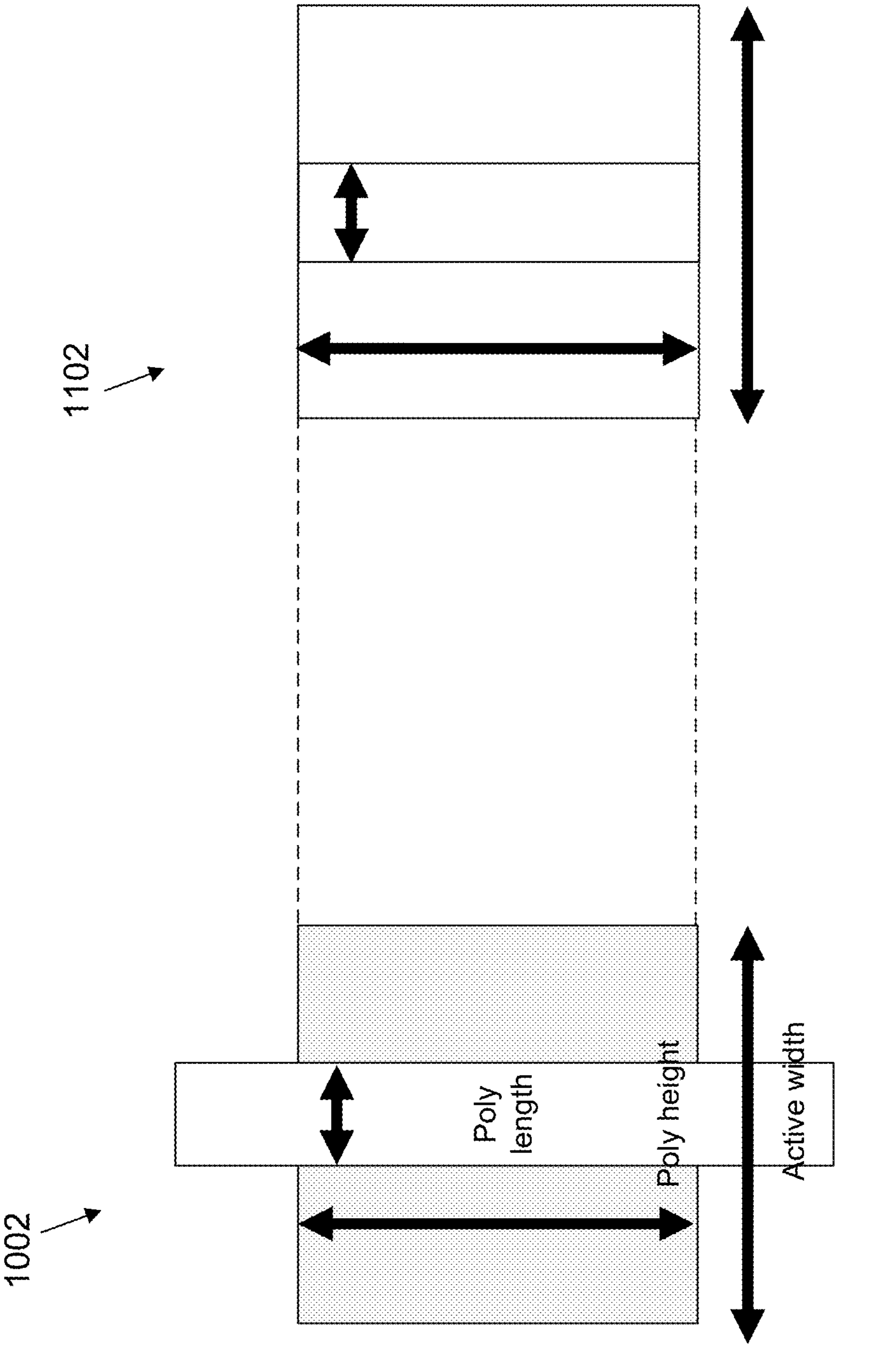
FIG. 11 is a schematic that shows source patterns and optional marker layers inside the pattern library, in accordance with an embodiment of the present disclosure.

FIG. 11 is a schematic that shows source patterns and optional marker layers inside the pattern library, in accordance with an embodiment of the present disclosure. Optional marker layers 1102 correspond to the source pattern 1002.

In some embodiments, the input design may be matched against source patterns from the pattern library using any pattern matching method, without deviating from the scope of the present disclosure. For example, in one embodiment, the input design is matched against the source patterns using a smart anchor approach for pattern matching in circuit verification.

The smart anchor approach is an efficient method instead of simply running through all source and match at every location. In some aspects, a pattern matching engine generates an anchor point for input design based on the anchor information stored in the pattern library.

In some embodiments, first a smart anchor approach selects an anchor type. There are multiple anchor types including a vertex, a 90° concave vertex, and a rectangle shape. The anchor type may be selected at random from among the anchor types that have not yet been selected for an integrated circuit (IC) pattern. The IC pattern is another term for a source pattern. Alternatively, the anchor types may be ranked and the anchor types are selected according to their rank (e.g., highest ranked anchor type is selected first, lowest ranked anchor type is selected first, etc.). The selected IC pattern may have one or more layers. Each layer may be of a specific type (e.g., metal, via, gate, oxide, etc.).

Secondly, a set of candidate anchors of the anchor type for each layer of the IC pattern is generated. If the selected anchor type has one or more dimension parameters, candidate anchor generation is regulated by the dimension parameters. For some anchor types (e.g., vertex), there may be multiple candidate anchors generated for a layer of the selected IC pattern. For other anchor types, (e.g., non-rectangle shape), there might only be one candidate anchor generated for a layer of the selected IC pattern. Moreover, for some anchor types, there might be zero candidate anchors generated for a layer of the IC pattern.

Thirdly, a pattern anchor for each layer from the candidate anchors is selected. One of the candidate anchors in a layer of the IC pattern is selected as the pattern anchor for the layer of the IC pattern. If the IC pattern has multiple layers, this may be performed for each layer. The pattern anchor for a layer of the IC pattern may be selected at random from the set of candidate anchors in the layer. Alternatively, the candidate anchor closest to the center of the layer of the IC pattern (e.g., having the shortest distance to the center of the layer of the IC pattern) may be selected as the pattern anchor of the layer of the IC pattern. Finally, a match time estimate for each layer based on the anchor type is calculated and the pattern anchor that can minimize the total pattern matching runtime is selected.

Figure 12:
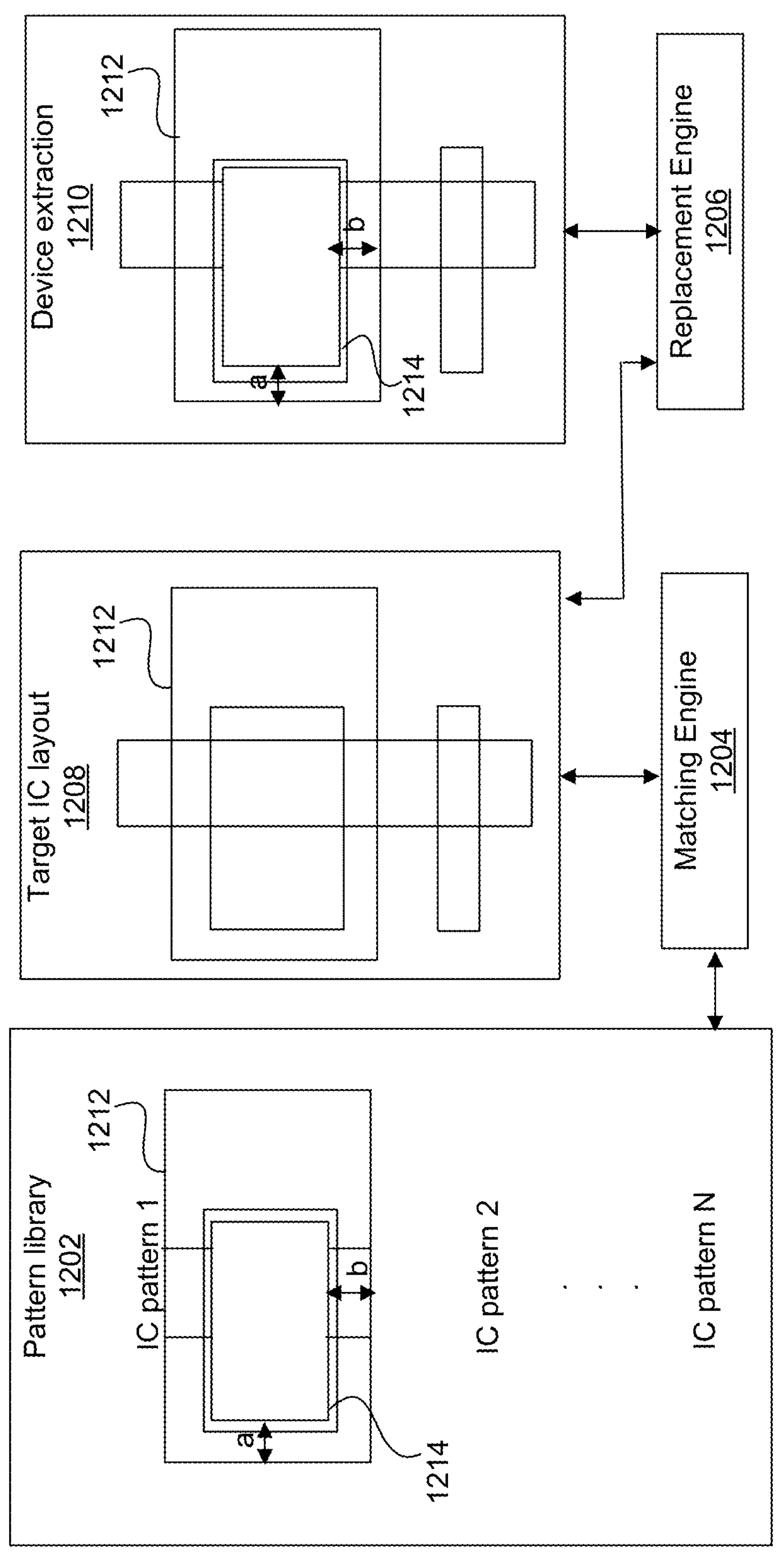
FIG. 12 is a schematic that shows pattern extraction at a matched location, in accordance with an embodiment of the present disclosure.

FIG. 12 is a flow diagram 1200 of the pattern extraction and replacement, in accordance with an embodiment of the present disclosure. A matching engine 1204 may compare patterns (e.g., IC pattern 1, IC pattern 2, . . . , IC pattern N) in a pattern library 1202 with a target IC layout 1208. The matching engine 1204 may detect the patterns inside a box 1212 (or pattern extent) as a matched pattern. A replacement engine 1206 can extract a pattern 1214 through calculating a relative location (a and b) from the extent of box 1212. The matching engine 1204 and the replacement engine 1206 may be implemented using a processor device. In some embodiments, the matching engine 1204 and the replacement engine 1206 may be implemented using processing device 1702 of computer system 1700 of FIG. 17.

Figure 13:
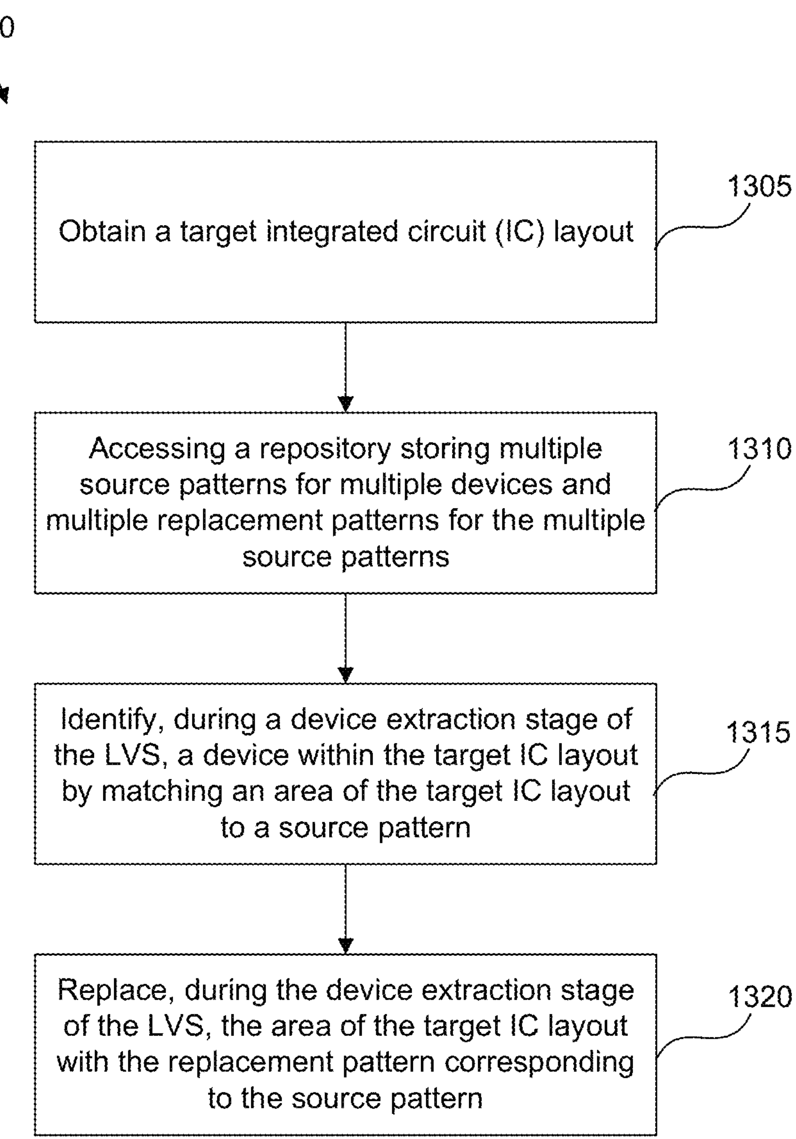
FIG. 13 shows a flowchart for pattern matching-based LVS device extraction, in accordance with an embodiment of the present disclosure.

FIG. 13 shows a flowchart for pattern matching-based LVS device extraction in accordance with an embodiment of the present disclosure.

At 1305, a target IC layout is obtained. The target IC layout may include any number of devices including, for example, adders, inverters, transistors, and the like.

At 1310, a repository is accessed. The repository stores source patterns for devices that may appear in the target IC layout and replacement patterns corresponding to the source patterns. A source pattern includes one or more device layers (e.g., poly, active, nplus) for the corresponding device, and the corresponding replacement pattern includes one or more optional marker layers (e.g., body, terminal). The source patterns and/or replacement patterns may be generated using any method including any of the methods discussed above.

At 1315, during a device extraction stage of the LVS, a device within the target IC layout is identified by matching an area of the target IC layout to one of the source patterns.

The matching may be performed using a smart anchor technique (discussed above). Additionally or alternatively, the matching may including scaling dimensions of layers within the source pattern (as shown inn FIG. 11).

At 1320, also during the device extraction stage of the LVS, the area of the target IC layout is replaced with the replacement pattern for the device (the replacement pattern corresponding to the matching source pattern). If the source pattern is scaled to execute the match, the replacement pattern may be scaled by a similar amount.

The steps 1315 and 1320 may be performed multiple times for each device in the target IC layout. Following the replacement, the remaining stages of LVS (e.g., connect/texting (text short/open and c_thru), compare) may be executed.

In some aspects, the output layers for a device may be generated using the following script:

```
n_real_gate_1=tngate3b and OD
n_real_gate_2= . . .
n_real_gate_3= . . .
n_real_gate_4= . . .
n_real_gate_5=n_real_gate_4 and OD2
n_real_gate_6=n_real_gate_5 and PO
n_real_gate_7= . . .
n_real_gate_8= . . .
. . . .
n_real_gate=n_real_gate and NP
```

where OD represents thin oxide of device layers, PO represents polysilicon oxide layers of the device. The script uses Boolean operations between the layers of the device.

Figure 14:
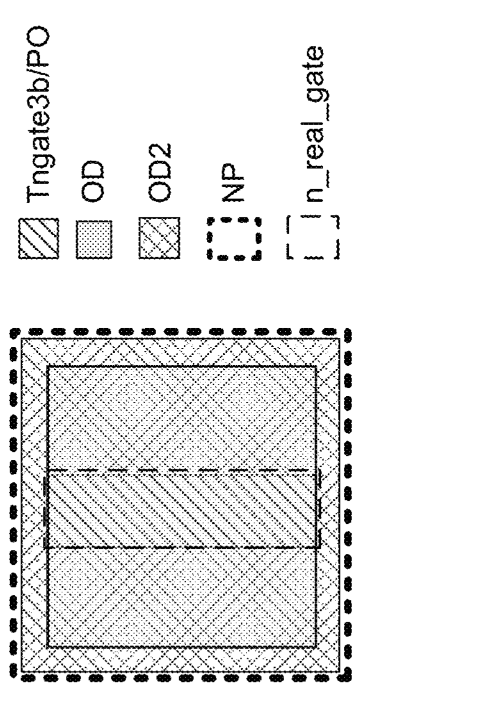
FIG. 14 is a schematic that shows a pattern library, in accordance with an embodiment of the present disclosure.

FIG. 14 is a schematic that shows pattern layers of the pattern library, in accordance with an embodiment of the present disclosure. The pattern library is generated using all layers that have Boolean operation for the device. The final patterns that exist in the pattern library are the pattern layers (i.e., Tngate3b/PO, OD2, NP). That is, the layer having an AND operation. The optional marker layer or the body layer is labelled "n_real_gate" in FIG. 14.

As described above, a complex Boolean operation of a typical device extraction may be replaced by the present pattern matching based device extraction with the five pattern layers (input layers) and an optional marker layer (output layer).

A runset to obtain the output layers using Bolean operations for an adder design is shown below:

```
pactive=PDIFF and NWELL;
nactive=NDIFF not NWELL;
subtie=PDIFF not NWELL;
welltie=NDIFF and NWELL;
pactive=PDIFF not subtie;
nactive=NDIFF not welltie;
ngate=POLY and nactive;
pgate=POLY and pactive;
fpoly=POLY not (ngate or pgate);
nsd=nactive not ngate;
psd=pactive not pgate;
```

In comparison, the runset to obtain the output layers using the present pattern matching-based device extraction for the adder is shown below:

```
m2= pattern_library (
   library_name=SPM_LIB_NAME,
   library_path= SPM_LIB_PATH
);
// run patter match
hs= pattern_match (
   pattern_library_handle        =m2,
   pattern_library_name          = " ".
   pattern_layers                = {NDIFF, PDIFF, NWELL,
POLY}
   // report_orientations         = ONE
};
// output pattern info of matched patterns
pattern_optional_markers= pattern_extract (
      pattern_library_name = " ".
      pattern_marker = hs,
```

-continued

```
        pattern__library__handle = m2,
        output__type = PM__OPTIONAL__MARKERS
    );
```

As previously described, the runset to obtain the output layers using the present pattern matching-based device extraction does not include Boolean operations. Thus, the runtime is improved.

Figure 15B:
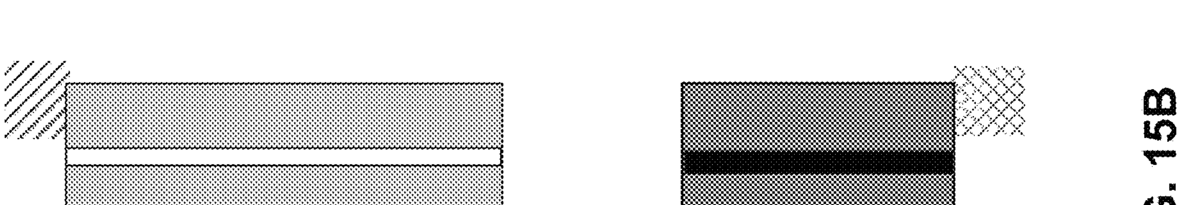
FIG. 15B is a schematic that shows output layers of the adder design, in accordance with an embodiment of the present disclosure.
Figure 15A:
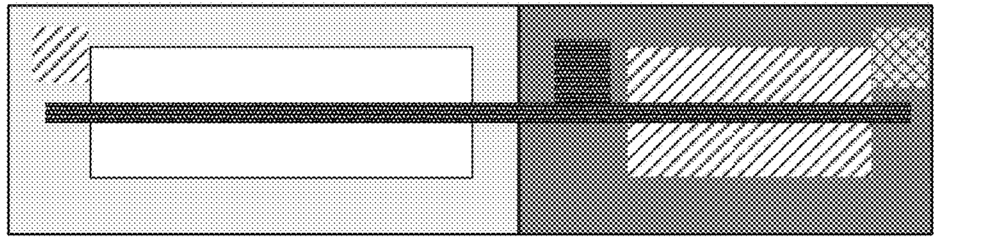
FIG. 15A is a schematic that shows input layers of an adder design, in accordance with an embodiment of the present disclosure.

FIGS. 15A and 15B show the input and output layers, respectively, in the pattern library of the adder design. The input layers and the output layers correspond to a source pattern and a replacement pattern respectively. As shown, the Boolean operations are minimized when using the approaches described herein. FIG. 15A shows a plurality of input layers of the adder and FIG. 15B shows the output layers for the adder. The input layers includes poly, nactive, pactive, and nwell layers. The output layers include terminal layers and body layers (similar to FIG. 8A).

Figure 16:
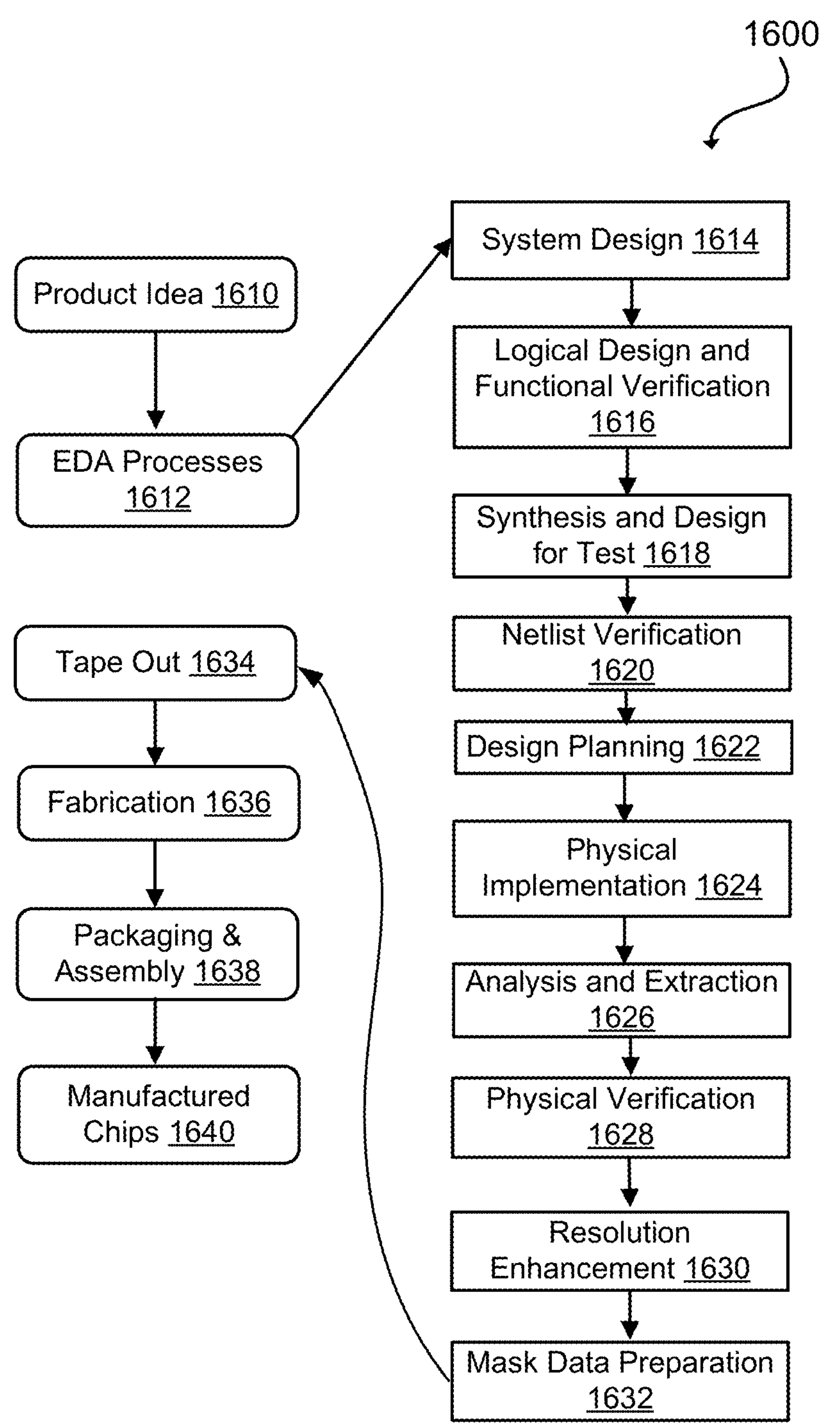
FIG. 16 depicts a flowchart of various processes used during the design and manufacture of an integrated circuit in accordance with some embodiments of the present disclosure.

FIG. 16 illustrates an example set of processes 1600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1610 with information supplied by a designer, information which is transformed to create an article of manufacture that uses a set of EDA processes 1612. When the design is finalized, the design is taped-out 1634, which is when artwork (e.g., geometric patterns) for the integrated circuit is sent to a fabrication facility to manufacture the mask set, which is then used to manufacture the integrated circuit. After tape-out, a semiconductor die is fabricated 1636 and packaging and assembly processes 1638 are performed to produce the finished integrated circuit 1640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('JUL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 16. The processes described can be enabled by EDA products (or EDA systems).

During system design 1614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1620, the netlist is checked for compliance with timing constraints and for correspondence with the HDL code. During design planning 1622, an overall floor plan for the integrated circuit is constructed and analyzed for timing and top-level routing.

During layout or physical implementation 1624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1626, the circuit function is verified at the layout level, which permits refinement of the layout design. In some aspects, the pattern matching-based LVS device extraction described herein may be applied. During physical verification 1628, the layout design is checked to ensure that manufacturing constraints are correct, such as DRC constraints, electrical constraints, lithographic constraints, and that circuitry function matches the HDL design specification. During resolution enhancement 1630, the geometry of the layout is transformed to improve how the circuit design is manufactured.

During tape-out, data is created to be used (after lithographic enhancements are applied if appropriate) for production of lithography masks. During mask data preparation 1632, the 'tape-out' data is used to produce lithography masks that are used to produce finished integrated circuits.

A storage subsystem of a computer system (such as computer system 1700 of FIG. 17) may be used to store the programs and data structures that are used by some or all of the EDA products described herein, and products used for development of cells for the library and for physical and logical design that use the library.

Figure 17:
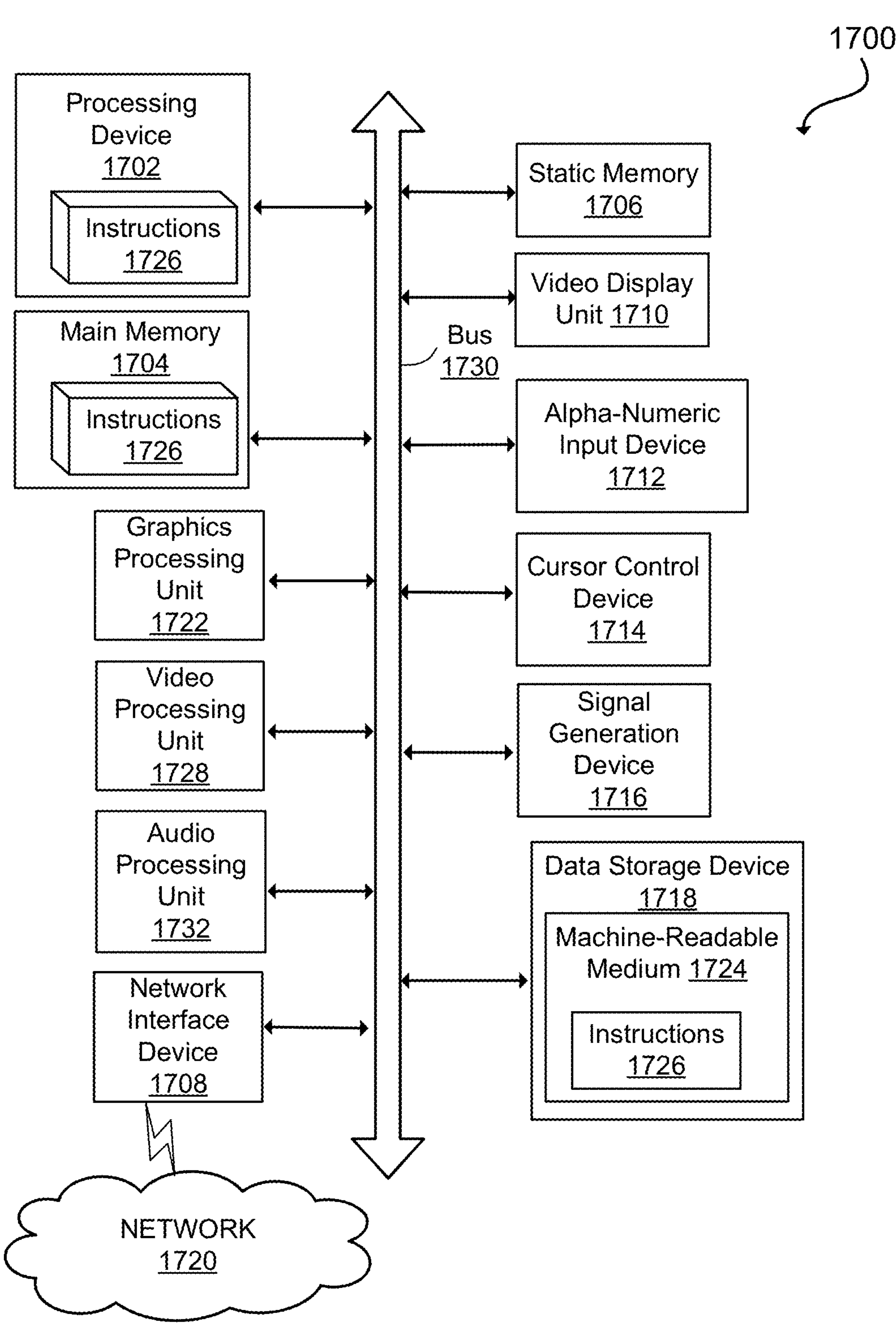
FIG. 17 depicts a diagram of an example computer system in which embodiments of the present disclosure may operate.

FIG. 17 illustrates an example machine of a computer system 1700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM), a static memory 1706 (e.g., flash memory, static random access memory (SRAM), etc.), and a data storage device 1718, which communicate with each other via a bus 1730.

Processing device 1702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. The processing device 1702 may be configured to execute instructions 1726 for performing the operations and steps described herein.

The computer system 1700 may further include a network interface device 1708 to communicate over the network 1720. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse), a graphics processing unit 1722, a signal generation device 1716 (e.g., a speaker), graphics processing unit 1722, video processing unit 1728, and audio processing unit 1732.

The data storage device 1718 may include a machine-readable storage medium 1724 (also known as a non-transitory computer-readable medium) on which is stored one or more sets of instructions 1726 or software embodying any one or more of the methodologies or functions described herein. The instructions 1726 may also reside, completely or at least partially, within the main memory 1704 and/or within the processing device 1702 during execution thereof by the computer system 1700, the main memory 1704 and the processing device 1702 also constituting machine-readable storage media.

In some implementations, the instructions 1726 include instructions to implement functionality corresponding to the present disclosure. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:

obtaining a target integrated circuit (IC) layout;

accessing a repository storing:

a source pattern for a device, the source pattern comprising a plurality of device layers; and a replacement pattern corresponding to the source pattern, wherein the replacement pattern comprises a plurality of marker layers, the plurality of marker layers comprising at least one of a body layer or a terminal layer;

identifying, using one or more processors, the device within the target IC layout by matching an area of the target IC layout to the source pattern; and replacing, using the one or more processors, at least a portion of the area of the target IC layout with the replacement pattern.

2. The method of claim 1, wherein the plurality of device layers comprises a poly layer.

3. The method of claim 1, wherein the matching comprises scaling a dimension of the source pattern.

4. The method of claim 1, further comprising:

acquiring from a manufacturer database information associated with a cell; and generating the replacement pattern by applying a Boolean operation into a device layer of the cell.

5. The method of claim 4, further comprising: associating an identifier with the cell; and extracting the replacement pattern based on the identifier.

6. The method of claim 1, wherein the repository includes sizing information associated with the source pattern, and the method further comprising:

identifying the device based on the sizing information.

7. The method of claim 1, further comprising:

determining the replacement pattern based on a relative location of the replacement pattern from a pattern extent of the source pattern.

8. A system, comprising: a repository storing:

a source pattern for a device, the source pattern comprising a plurality of device layers; and a replacement pattern corresponding to the source pattern, wherein the replacement pattern comprises a plurality of marker layers, the plurality of marker layers comprising at least one of a body layer or a terminal layer;

a memory storing instructions; and a processor, coupled with the memory and to execute the instructions, the instructions when executed cause the processor to:

obtain a target integrated circuit (IC) layout;

identify the device within the target IC layout by matching an area of the target IC layout to the source pattern; and replace at least a portion of the area of the target IC layout with the replacement pattern.

9. The system of claim 8, wherein the plurality of device layers comprises a poly layer.

10. The system of claim 8, wherein the matching comprises scaling a dimension of the source pattern.

11. The system of claim 8, wherein the processor is further configured to:

acquire from a manufacturer database information associated with a cell; and generate the replacement pattern by applying a Boolean operation into a device layer of the cell.

12. The system of claim 11, wherein the processor is further configured to:

associate an identifier with the cell; and extract the replacement pattern based on the identifier.

13. The system of claim 8, wherein the repository includes sizing information associated with the source pattern, and the processor is further configured to:

identify the device based on the sizing information.

14. The system of claim 8, wherein the processor is further configured to:

determine the replacement pattern based on a relative location of the replacement pattern from a pattern extent of the source pattern.

15. A non-transitory computer readable medium comprising stored instructions, the instructions, which when executed by a processor, cause the processor to:

generate a pattern library, wherein the pattern library comprises a source pattern of a device and a replacement pattern corresponding to the source pattern, wherein the source pattern comprises a plurality of device layers, and wherein the replacement pattern comprises a plurality of marker layers, the plurality of marker layers comprising at least one of a body layer or a terminal layer;

acquire an input integrated circuit (IC) design;

perform pattern matching between the input IC design and the pattern library; and output the replacement pattern corresponding to a matched source pattern.

16. The non-transitory computer readable medium of claim 15, wherein the plurality of device layers comprises a poly layer.

17. The non-transitory computer readable medium of claim 15, wherein the processor is configured to:

acquire from a manufacturer database information associated with a cell; and generate the replacement pattern by applying a Boolean operation into a device layer of the cell.

18. The non-transitory computer readable medium of claim 15, wherein a repository includes sizing information associated with the source pattern, and the processor is configured to:

identify the device based on the sizing information.

* * * * *